United States Patent
Yudistira et al.

(10) Patent No.: US 12,394,665 B2
(45) Date of Patent: Aug. 19, 2025

(54) METHOD FOR PRODUCING AN UNDERCUT IN A 300mm SILICON-ON-INSULATOR PLATFORM

(71) Applicant: IMEC VZW, Leuven (BE)

(72) Inventors: Didit Yudistira, Kessel-Lo (BE); Alexey Milenin, Heverlee (BE)

(73) Assignee: Imec vzw, Leuven (BE)

( * ) Notice: Subject to any disclaimer, the term of this patent is extended or adjusted under 35 U.S.C. 154(b) by 99 days.

(21) Appl. No.: 17/329,556

(22) Filed: May 25, 2021

(65) Prior Publication Data

US 2021/0375668 A1  Dec. 2, 2021

(30) Foreign Application Priority Data

May 28, 2020 (EP) .................................... 20177037

(51) Int. Cl.
| | |
|---|---|
| *H01L 21/762* | (2006.01) |
| *H01L 21/306* | (2006.01) |
| *H01L 21/3065* | (2006.01) |
| *H01L 23/00* | (2006.01) |

(52) U.S. Cl.
CPC .. *H01L 21/76289* (2013.01); *H01L 21/30604* (2013.01); *H01L 21/3065* (2013.01); *H01L 23/564* (2013.01)

(58) Field of Classification Search
CPC ......... H01L 21/76289; H01L 21/30604; H01L 21/3065; H01L 23/564
See application file for complete search history.

(56) References Cited

U.S. PATENT DOCUMENTS

| | | | | |
|---|---|---|---|---|
| 5,143,862 A | * | 9/1992 | Moslehi | H01L 21/76248 438/413 |
| 6,051,866 A | * | 4/2000 | Shaw | B81C 1/00626 73/DIG. 1 |
| 6,388,300 B1 | * | 5/2002 | Kano | B81B 3/0086 257/419 |
| 7,628,932 B2 | * | 12/2009 | Lee | C30B 33/10 216/99 |
| 7,709,341 B2 | * | 5/2010 | Fucsko | H01L 21/30608 438/746 |

(Continued)

OTHER PUBLICATIONS

Extended European Search Report from the European Patent Office, mailed Nov. 12, 2020, for European Patent No. 20177037.7, pp. 1-10.

*Primary Examiner* — Norman D Richards
*Assistant Examiner* — Sean Ayers Winters
(74) *Attorney, Agent, or Firm* — McDonnell Boehnen Hulbert & Berghoff LLP

(57) ABSTRACT

A Silicon on Insulator (SOI) structure and a method for creating an undercut (UCUT) in an SOI structure, in particular, for a 300 mm SOI platform, is provided. In particular, the method includes fabricating one or more cavities in a silicon substrate underneath an insulator layer of the SOI structure by performing a first dry etch of the silicon substrate to create the one or more cavities, performing a first wet etch of the silicon substrate to expand the one or more cavities, performing a second dry etch of the silicon substrate to further expand the one or more cavities and to break silicon facets created by the first wet etch, and performing a second wet etch to further expand the one or more cavities.

15 Claims, 7 Drawing Sheets

(56) References Cited

U.S. PATENT DOCUMENTS

| | | | |
|---|---|---|---|
| 9,024,368 B1* | 5/2015 | Yu | H01L 29/7848 257/288 |
| 2002/0081809 A1* | 6/2002 | Pinto | H01L 21/76264 438/296 |
| 2004/0258344 A1 | 12/2004 | Fardi et al. | |
| 2007/0281493 A1 | 12/2007 | Fucsko et al. | |
| 2008/0205133 A1* | 8/2008 | Gonzalez | G11C 11/405 257/E27.084 |
| 2008/0220589 A1* | 9/2008 | Murakami | H01L 22/24 438/459 |
| 2009/0176347 A1* | 7/2009 | Cheng | H10B 12/0387 257/E21.09 |
| 2009/0274418 A1 | 11/2009 | Holzwarth et al. | |
| 2010/0213522 A1* | 8/2010 | Cheng | H10B 12/0387 438/386 |
| 2011/0104875 A1* | 5/2011 | Wojtczak | H10D 62/021 257/E21.09 |
| 2011/0250706 A1* | 10/2011 | Huff | B81C 99/006 716/139 |
| 2011/0284968 A1* | 11/2011 | Lee | H01L 29/66628 257/410 |
| 2013/0017660 A1* | 1/2013 | Fang | H01L 21/26513 257/E21.409 |
| 2013/0277795 A1 | 10/2013 | Assefa et al. | |
| 2013/0336613 A1 | 12/2013 | Meade et al. | |
| 2014/0001555 A1* | 1/2014 | Cheng | H01L 21/84 438/296 |
| 2014/0241682 A1 | 8/2014 | Sandhu et al. | |
| 2014/0302661 A1* | 10/2014 | Cheng | H01L 21/84 438/424 |
| 2015/0129983 A1* | 5/2015 | Yu | H01L 29/66795 438/283 |
| 2015/0206761 A1 | 7/2015 | Fucsko et al. | |
| 2016/0225849 A1* | 8/2016 | Wong | H01L 21/30604 |
| 2016/0284557 A1* | 9/2016 | Chen | H01L 21/0332 |
| 2016/0344368 A1* | 11/2016 | Ayazi | G01C 19/5712 |
| 2017/0199328 A1* | 7/2017 | Shubin | G02B 6/1228 |
| 2017/0338327 A1* | 11/2017 | Liu | H01L 29/6656 |
| 2018/0102442 A1* | 4/2018 | Wang | H01L 31/02327 |
| 2018/0350985 A1* | 12/2018 | Dasgupta | H01L 29/66522 |
| 2019/0259729 A1* | 8/2019 | Di Cioccio | H01L 24/09 |
| 2019/0288132 A1* | 9/2019 | Wang | H01L 31/1804 |
| 2020/0243664 A1* | 7/2020 | Chuang | H01L 29/42364 |
| 2022/0172981 A1* | 6/2022 | Reinmuth | H01L 21/02532 |

\* cited by examiner

METHOD FOR PRODUCING AN UNDERCUT IN A 300mm SILICON-ON-INSULATOR PLATFORM

CROSS-REFERENCE

This application claims priority from European Patent Application no. 20177037.7, filed May 28, 2020, which is incorporated by reference in its entirety.

TECHNICAL FIELD

The present disclosure is directed to a process for creating an undercut (UCUT) in a Silicon on Insulator (SOI) structure, in particular, in a 300 mm SOI platform. To this end, the disclosure provides a method for fabricating one or more cavities in a silicon substrate underneath an insulator layer of the SOI structure.

BACKGROUND OF THE DISCLOSURE

An UCUT comprises one or more cavities in a silicon substrate of an SOI structure, and can be typically achieved by undercutting the buried oxide of the SOI structure (i.e., the insulator layer) through local selective removal of the silicon substrate material. The UCUT can provide certain advantages in some Complementary Metal Oxide Semiconductor (CMOS) devices, in particular photonic devices. For instance, the UCUT may minimize an undesired leakage of heat. The heat may, for example, be generated by an integrated thermal heater in a thermally tunable CMOS ring modulator. The UCUT thus enables building a more efficient ring modulator, due to the reduced heat leakage, and leads to higher device reliability.

An exemplary method (process) for creating the UCUT in a 200 mm SOI platform comprises a selective isotropic bulk silicon etch, followed by a longer wet etch, for example, performed for 90 minutes with highly concentrated TMAH (e.g., a concentration of 25%) at a temperature of 80° C. The exemplary method further comprises a subsequent cleaning sequence including a rinse with distilled water (DIW rinse) and a rinse with isopropyl alcohol (IPA rinse), performed for another 90 minutes.

A disadvantage of this exemplary method is that the total process time, until one or more cavities with desired dimension(s) are completed in the silicon substrate of the SOI structure, is about 3 hours or more. Another disadvantage is that the wet etch needs to be carried out in a dedicated wet etching bench, thus specific processing equipment is required. If the exemplary method would be transferred to the 300 mm platform, additional costs would thus arise.

SUMMARY OF THE DISCLOSURE

In view of the above-mentioned disadvantages of the exemplary method, embodiments of the present disclosure aim to provide an improved method for creating a UCUT in a SOI structure. An objective is, in particular, to provide a method that enables creating one or more cavities in a silicon substrate underneath an insulator layer of the SOI structure, wherein the overall process time of the method is reduced compared to the exemplary method. Furthermore, the method should be suited for integration into a 300 mm SOI (photonic) platform, wherein it should not be necessary to invest in specific additional processing equipment.

The objective is achieved by embodiments of the disclosure as, for example, provided in the enclosed independent claims. Advantageous implementations of these embodiments are defined in the dependent claims.

In particular, embodiments of the disclosure implement a new process for creating the UCUT, wherein the process comprises a combination of a bulk silicon dry etch and a short wet etch. The process is well scalable, meaning that the dimension(s) of the UCUT dimensions (e.g., the sizes of the one or more cavities produced in the silicon substrate) can be extended as desired, by repeating more cycles of dry etch and wet etch. Thus, any profile required can be reached.

A first aspect of the present disclosure provides a method for fabricating one or more cavities in a silicon substrate underneath an insulator layer of a SOI structure, the method comprising: performing a first dry etch of the silicon substrate to create the one or more cavities underneath the insulator layer; performing a first wet etch of the silicon substrate to expand the one or more cavities; performing a second dry etch of the silicon substrate to further expand the one or more cavities and to break silicon facets created by the first wet etch; and performing a second wet etch to further expand the one or more cavities.

Each wet etch creates facets in the silicon substrate, in particular 54° facets. This means, that the sidewalls of the one or more cavities align with the {111} silicon crystal planes. As a consequence, the etch rate slows down to the etch rate of a <111> etch, thereby extending the process time. Thus, the method of the first aspect comprises a "breaking" (or changing) of the silicon facets with a dry etch, wherein each dry etch is performed in between two wet etches. The breaking of the silicon facets significantly increases the etch rate of the subsequent wet etch, and thus the overall process time is reduced.

Very good results with the method of the first aspect have been demonstrated in a 300 mm (photonic) platform. In particular, the method can be directly implemented into the 300 mm platform, using tools that are already available for 300 mm, i.e., without any necessary extra investment. Notably, there can be a significant process time improvement associated with the method of the first aspect in the 300 mm platform, when compared to the exemplary method for the 200 mm platform described above.

In an implementation, the method further comprises: performing alternately one or more further dry etches and one or more further wet etches of the silicon substrate; wherein each further dry etch further expands the one or more cavities and breaks silicon facets created by the preceding wet etch; and wherein each further wet etch further expands the one or more cavities.

In this way, the wet etches and dry etches, respectively, can be cycled many times, until the desired dimensions of the one or more cavities in the silicon substrate are obtained.

In an implementation, the method further comprises, before performing the first dry etch: etching one or more trenches through the insulator layer and into the silicon substrate of the SOI structure; wherein the first dry etch is performed through the one or more trenches to create the one or more cavities underneath the insulator layer.

The trenches provide a simple but efficient way to access the silicon substrate underneath the insulator layer, in order to create the one or more undercut cavities in the silicon substrate.

In an implementation of the method, at least two adjacent cavities are formed in the silicon substrate, and the dry and wet etches are performed until the at least two adjacent cavities merge.

Thus, a larger cavity can be formed from two or more adjacent cavities in reasonably short time.

In an implementation of the method, the dry and wet etches can be performed until a top side of the one or more cavities reaches the insulator layer.

That is, in the end of the etching cycle(s), the top sides of the one or more (or each of the) cavities touch the bottom side of the insulator layer arranged above them.

In an implementation of the method, the dry etches are selective bulk silicon etches and/or isotropic etches.

In an implementation of the method, the dry etches each comprise an etching step containing fluorine.

In an implementation of the method, the dry etches each comprise an etching step using sulfur hexafluoride ($SF_6$) or xenon difluoride ($XeF_2$) in combination with argon or helium.

In an implementation of the method, the dry etches can each be performed for a duration of 1000-1400 s at a temperature of 80-120° C.

These dry etches can allow for an efficient breaking of the silicon facets, and at the same time an expansion of the one or more cavities.

In an implementation of the method, the wet etches are anisotropic wet etches.

In an implementation of the method, the wet etches each comprise an etching step using tetramethylammonium hydroxide (TMAH) and/or potassium hydroxide (KOH).

In an implementation of the method, the wet etches each further comprise an etching step using hydrogen fluoride (HF) to remove native oxide.

In an implementation of the method, the wet etches each comprise an etching step using 0.2-0.4% hydrogen fluoride (HF) for a duration of 10-20 s followed by an etching step using 2-8% tetramethylammonium hydroxide (TMAH) for a duration of 400-800 s at a temperature of 75-85° C.

These wet etches allow an expansion of the one or more cavities in a reasonable short time frame.

The above-given parameters for the wet etch and the dry etch, lead to the best results in terms of process time and quality of the one or more cavities.

In an implementation, the method further comprises: performing a step of stripping and/or cleaning between each dry etch and the subsequent wet etch.

A second aspect of this disclosure provides a SOI structure, comprising: a silicon substrate, an insulator layer, and one or more cavities formed underneath the insulator layer; wherein the SOI structure is fabricated using the method according to the first aspect or any implementation form thereof.

The SOI structure of the second aspect can achieve the same advantages as the method of the first aspect. The SOI structure shows characteristics of the method of the first aspect, with which it was fabricated. That is, the SOI structure produced with the method of the first aspect can be distinguishable from a SOI structure, for instance, produced by the exemplary method described above.

BRIEF DESCRIPTION OF THE DRAWINGS

The above described aspects and implementations are explained in the following description of embodiments with respect to the enclosed drawings.

DETAILED DESCRIPTION OF EMBODIMENTS OF THE DISCLOSURE

Figure 1:
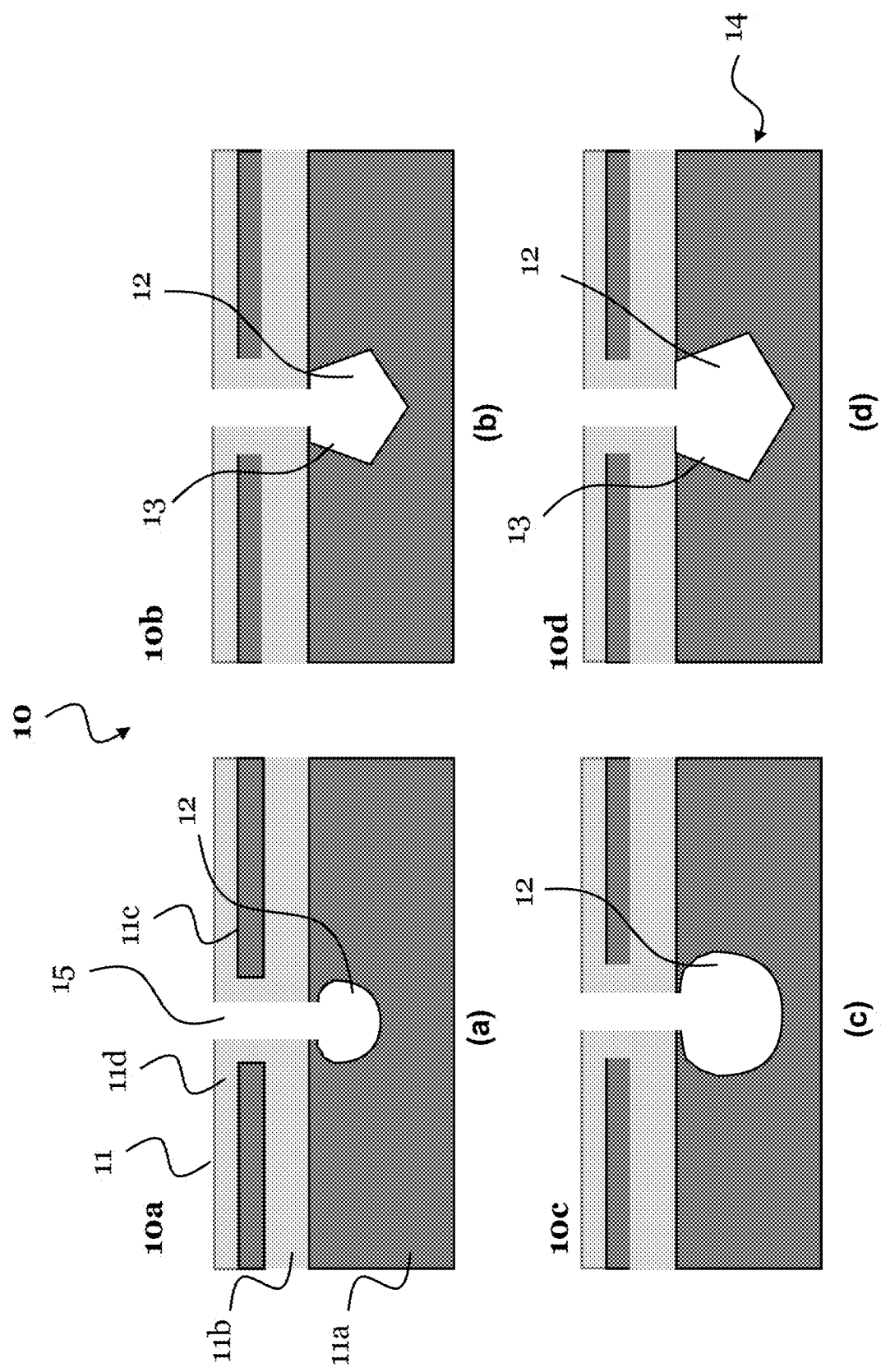
FIG. 1, parts (a) to (d), shows a general method according to an embodiment of the disclosure, for creating one or more cavities in a silicon substrate of a SOI structure (i.e., a UCUT).

FIG. 1, parts a to d, shows a general method 10 according to an embodiment of the disclosure. The method 10 can be suitable for fabricating one or more cavities 12 in a silicon substrate 11a of a SOI structure 11, wherein the one or more cavities 12 are arranged underneath (in particular, directly underneath) an insulator layer 11b of the SOI structure 11. The insulator layer 11b can be provided on the silicon substrate 11a. On the insulator layer 11b (e.g. silicon oxide), a silicon layer 11c can be provided, and the silicon layer 11c can be covered, particularly encapsulated, by an oxide layer 11d (e.g., silicon oxide). Thus, the method 10 can be suitable for producing an UCUT in the SOI structure 11, and can be performed, e.g., in a 300 mm silicon (photonics) platform.

The method 10 comprises a step 10a of performing a first dry etch of the silicon substrate 11a, in order to create the one or more cavities 12 underneath the insulator layer 11b. Step 10a may also include, before the first dry etch, the etching of a trench 15 (also referred to as a chimney) through the oxide layer 11d, the silicon layer 11c, and the insulator layer 11b, into the substrate 11a. The first dry etch can then be carried out through the trench 15. Notably, the silicon layer 11c is not subjected to isotropic silicon etch at this stage of etching the trench 15 and opening the one or more cavities 12, due to the oxide layer 11d. Further, the anisotropic trench 15 etch process may be performed in a conventional manner (i.e., according to a standard process).

As an example, FIG. 1, parts (a) to (d), shows that only one cavity 12 can be fabricated. Step 10a provides the starting point for fabricating the one or more cavities 12, i.e. processing the cavities 12 until they reach the desired dimension(s). After step 10a, the one or more cavities 12 may not yet have their final desired dimension(s), for instance, a top side of the one or more cavities 12 does not yet touch the bottom side of the insulator layer 11b, as it may be desired for the final UCUT.

The method 10 comprises a further step 10b of performing a first wet etch of the silicon substrate 11a, to expand the one or more cavities 12. Expanding the cavities 12 means increasing the dimensions of each of the cavities 12, i.e., enlarging the one or more cavities 12 underneath the insulator layer 11b in the silicon substrate 11a. The wet etch may create silicon facets 13, in particular silicon facets 13 arranged along the <111> directions may be created, more particularly 54° facets 13.

The method 10 comprises a further step 10c of performing a second dry etch of the silicon substrate 11a, in order to further expand the one or more cavities 12, and at the same time to break the silicon facets 13 created by the first wet etch. In particular, breaking the silicon facets 13 means that the sidewalls of the one or more cavities 12 are not anymore aligned strictly along the <111> directions after the breaking, i.e., after performing the second dry etch.

The method 10 comprises a further step 10d of performing a second wet etch to further expand the one or more cavities 12. The second wet etch creates again silicon facets 13 as described above.

The method 10 may comprise further steps, in particular, it may comprise additional steps of performing, alternatingly, one or more further dry etches and one or more further wet etches of the silicon substrate 11a. Each further dry etch further expands the one or more cavities 12, as described above, and additionally breaks the silicon facets 13 created by the preceding wet etch, as also described above. Further, each further wet etch can further expand the one or more cavities 12, as described above. This cycling of interleaved wet etches and dry etches can be performed, until the desired cavity dimension(s) are obtained, or until the one or more cavities 12 touch a bottom side of the insulator layer 11b with their top sides. Alternatively, if more than one cavity 12 is produced, the cycling of the etch steps can be performed, until the cavities 12 merge, i.e., form one larger cavity beneath the insulator layer 11b in the silicon substrate 11a.

The proposed method 10 may thus fabricate a UCUT in the SOI structure, for example, in a 300 mm SOI platform, and with high process speed and efficiency. The method 10 may, in particular, be based on a combination of a selective isotropic bulk silicon dry etch, a short time wet etch (e.g., of HF 0.3% for 14 s), and a subsequent low concentration wet etch (e.g., TMAH 5% at 80° C. for 600 s). The latter wet etch does not only allow the increase of the cavity size through anisotropic etching, with e.g. the TMAH, but may also act as a cleaning step. Such a cleaning step may be beneficial for the subsequent dry etch.

The method 10 allows the dry etching to be repeated for several times. Notably, desired one or more cavities 12 may already be obtained with a combination of one dry etch and one wet etch. Otherwise, the etch steps of the method 10 can be repeated/continued by adding, for instance, further dry etch steps and/or further wet etch steps in an alternating manner, until the one or more cavities 12 reach the desired dimension(s). A total process time required by the method 10 for creating a conventional UCUT, could take only about one hour with the combination of two times dry etch and two times wet etch, respectively. The method 10 may further be carried out in a 300 mm platform, with the tools available.

Figure 2:
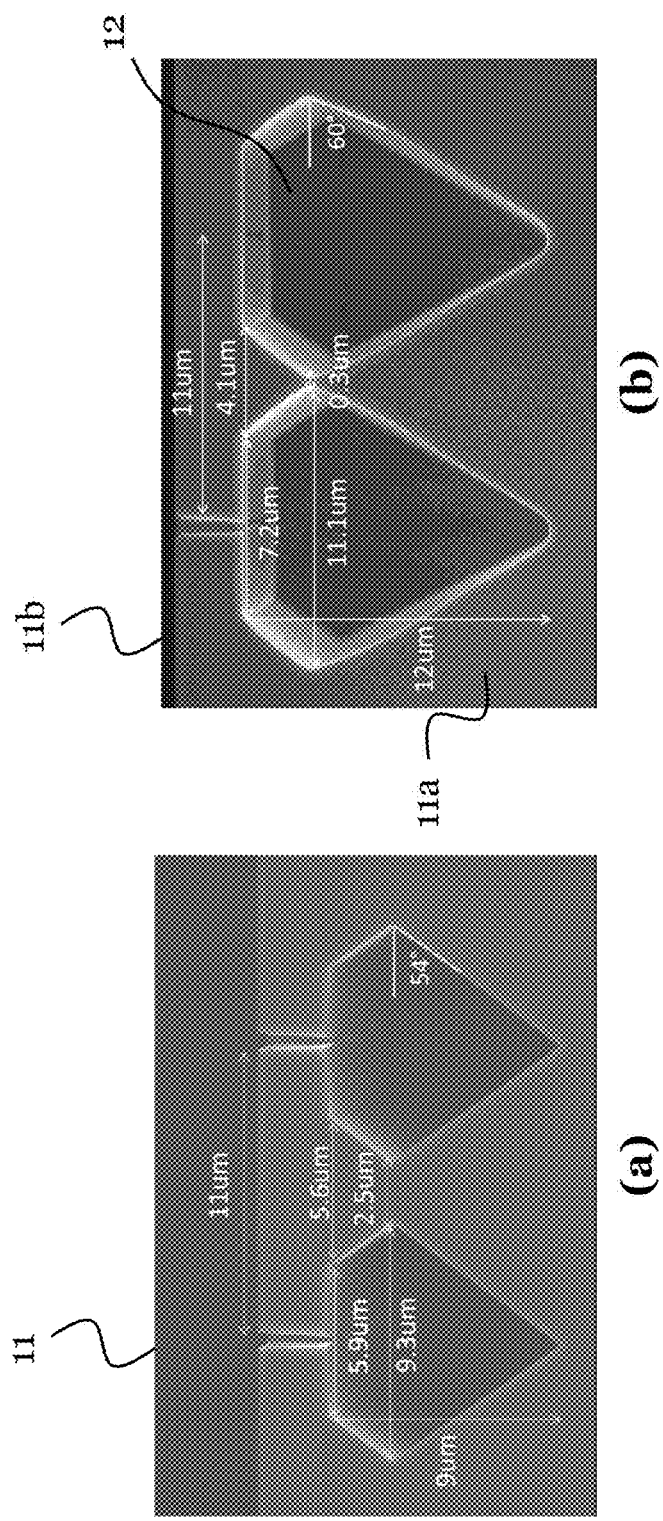
FIG. 2, parts (a) and (b), shows a comparison of a UCUT achieved with a method according to an embodiment of the disclosure, and a UCUT achieved with an exemplary method.

FIG. 2, part (a), shows a result of a UCUT achieved through a combination of a dry etch and a wet etch (i.e., an exemplary method), and FIG. 2(b) shows a result of a UCUT achieved by a method 10 according to an embodiment of the disclosure. In particular, the UCUT in FIG. 2, part (a), was obtained by a 1200 s selective bulk silicon dry etch followed by a wet etch comprising a 14 s HF etch (concentration 0.3%) and a subsequent 600 s TMAH etch (concentration 5%, temperature 80° C.). The UCUT in FIG. 2, part (b), was obtained by a 1200 s selective bulk silicon dry etch followed by a wet etch comprising a 14 s HF etch (concentration 0.3%) and a subsequent 600 s TMAH etch (concentration 5%, temperature 80° C.), followed by another 1200 s bulk silicon dry etch.

FIG. 2, part (a), shows that the TMAH etch creates a V-shaped UCUT formed by the facing <111> sidewalls on the silicon substrate, making angles of 54°. As it can be seen in FIG. 2, part (b), the second silicon dry etch allows further increasing the cavity size, but also leads to a change in the sidewalls orientations. In particular, the sidewalls are no longer facing <111>, as indicated by now a 60° angle. This breakage of the silicon facets 13 can be beneficial to promote a faster wet etch at the next cycle.

Figure 3:
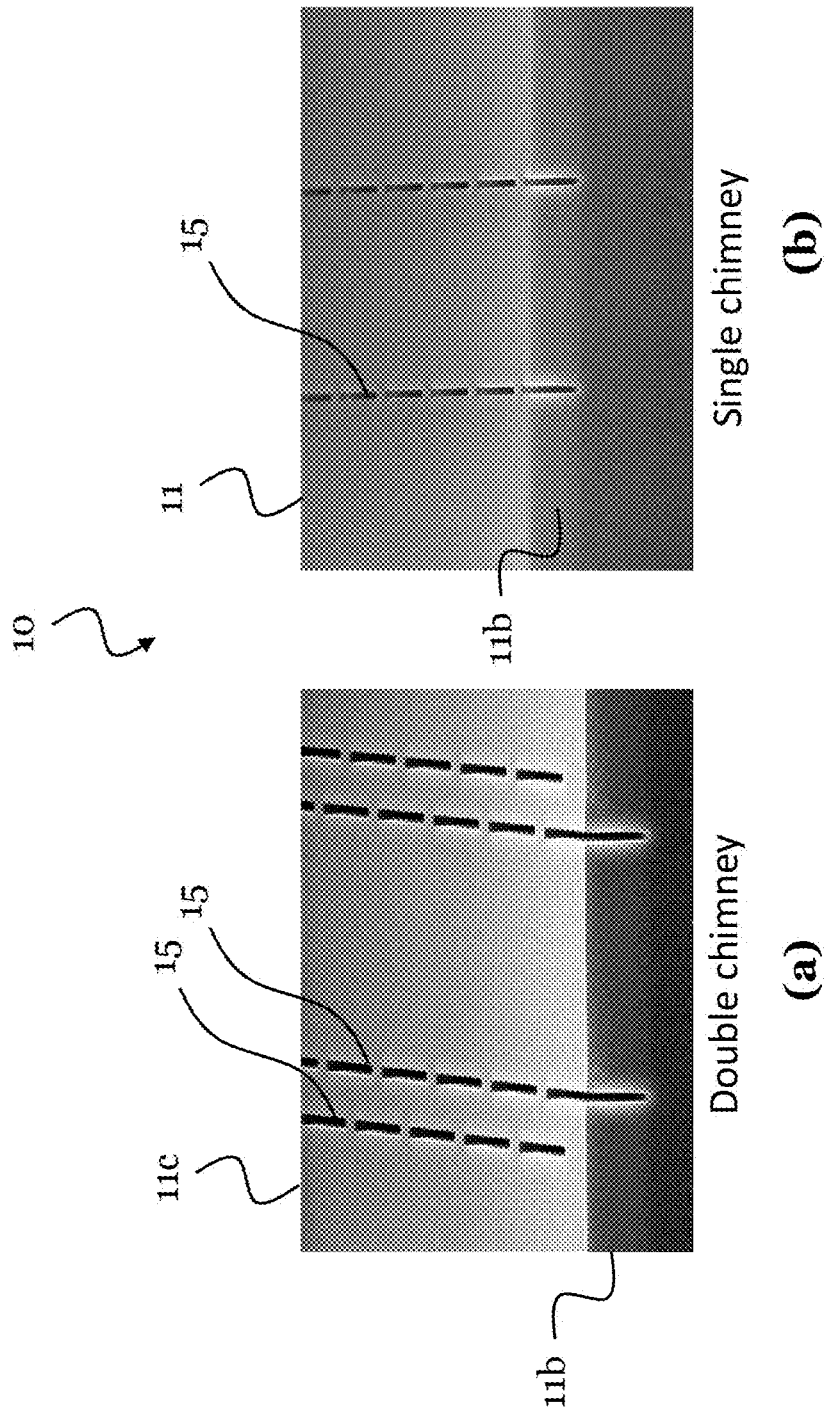
FIG. 3, parts (a) and (b), shows a step of a detailed method according to an embodiment of the disclosure for creating one or more cavities in a silicon substrate of a SOI structure (i.e., a UCUT).
Figure 7:
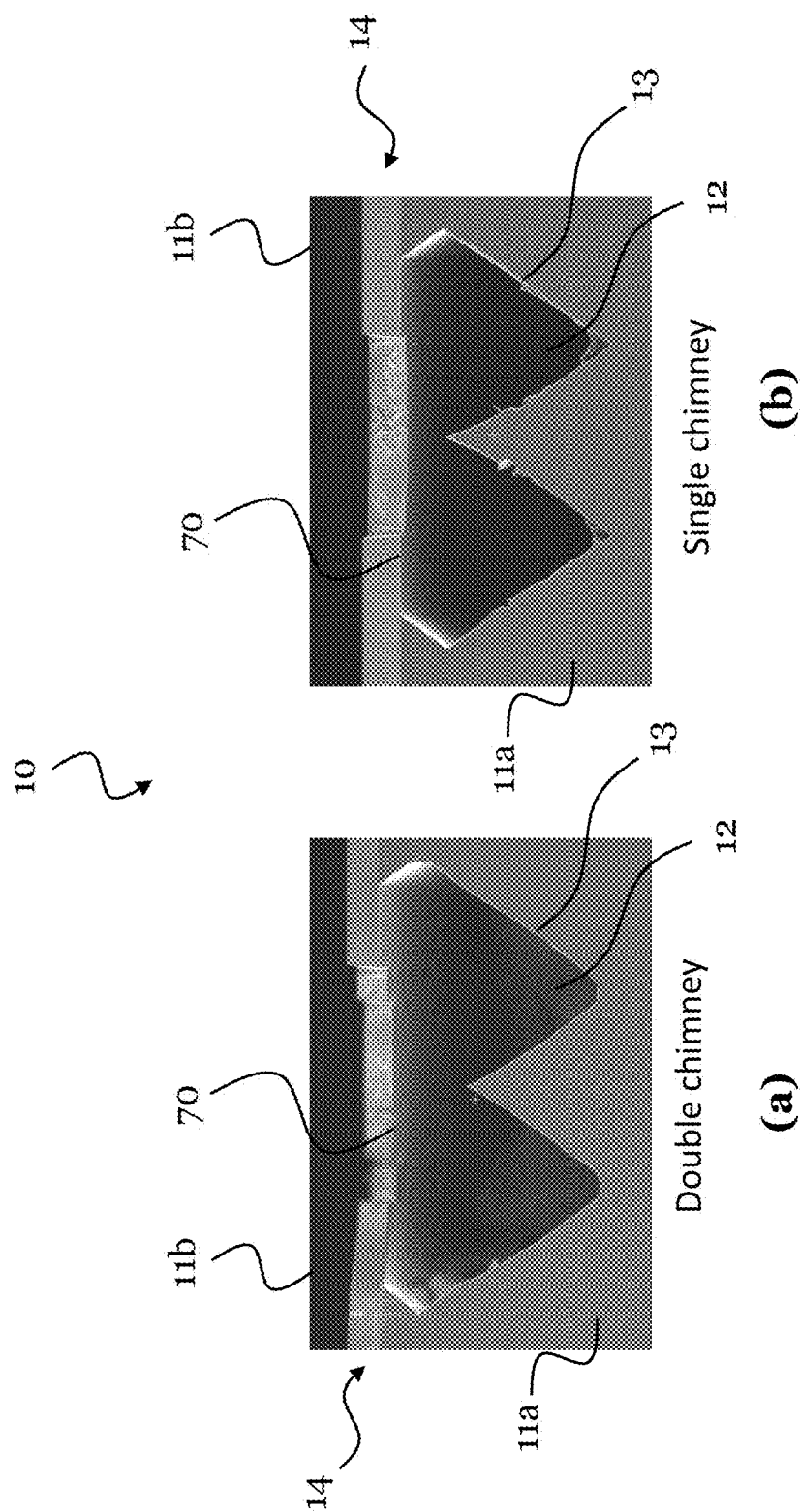
FIG. 7, parts (a) and (b), shows a further step of the detailed method according to an embodiment of the disclosure.

FIG. 3, parts (a) and (b), to FIG. 7, parts (a) and (b), show a detailed method 10 according to an embodiment of the disclosure, which builds on the embodiment of the method 10 shown in FIG. 1, parts (a) to (d). The left-sides (part (a)) in these figures show a variant of the method 10 referred to as "Double chimney", and the right-sides (part (b)) show a variant of the method 10 referred to as "Single chimney".

FIG. 3, parts (a) and (b), shows a step that may be performed before step 10a of performing the first dry etch. In this optional step, one or more trenches 15 can be etched through the insulator layer 11b and into the silicon substrate 11a of the SOI structure 11. The trenches 15 can allow easy access (for etching) to the silicon substrate 11a, in which the one or more cavities 12 are to be created. In particular, the first dry etch for creating the one or more cavities 12 may be performed through the one or more trenches 15. That is, the openings to the silicon substrate 11a, provided by the trenches 15, can be used to insert/bring reactants to the silicon substrate 11a, and beneath the insulator layer 11b. In the "Double chimney" variant (a) of the method 10, adjacent pairs of closely spaced trenches 15 are created, in order to create one or more pairs of cavities 12 that are very close together from the start, wherein a distance between one pair to the other is larger. Of course, also "Triple chimney" variants of the method 10 (and more) may be possible. In the "Single chimney" variant (b) of the method 10, the created trenches 15 are further apart from another, and create, for instance, evenly spaced cavities 12.

Figure 4:
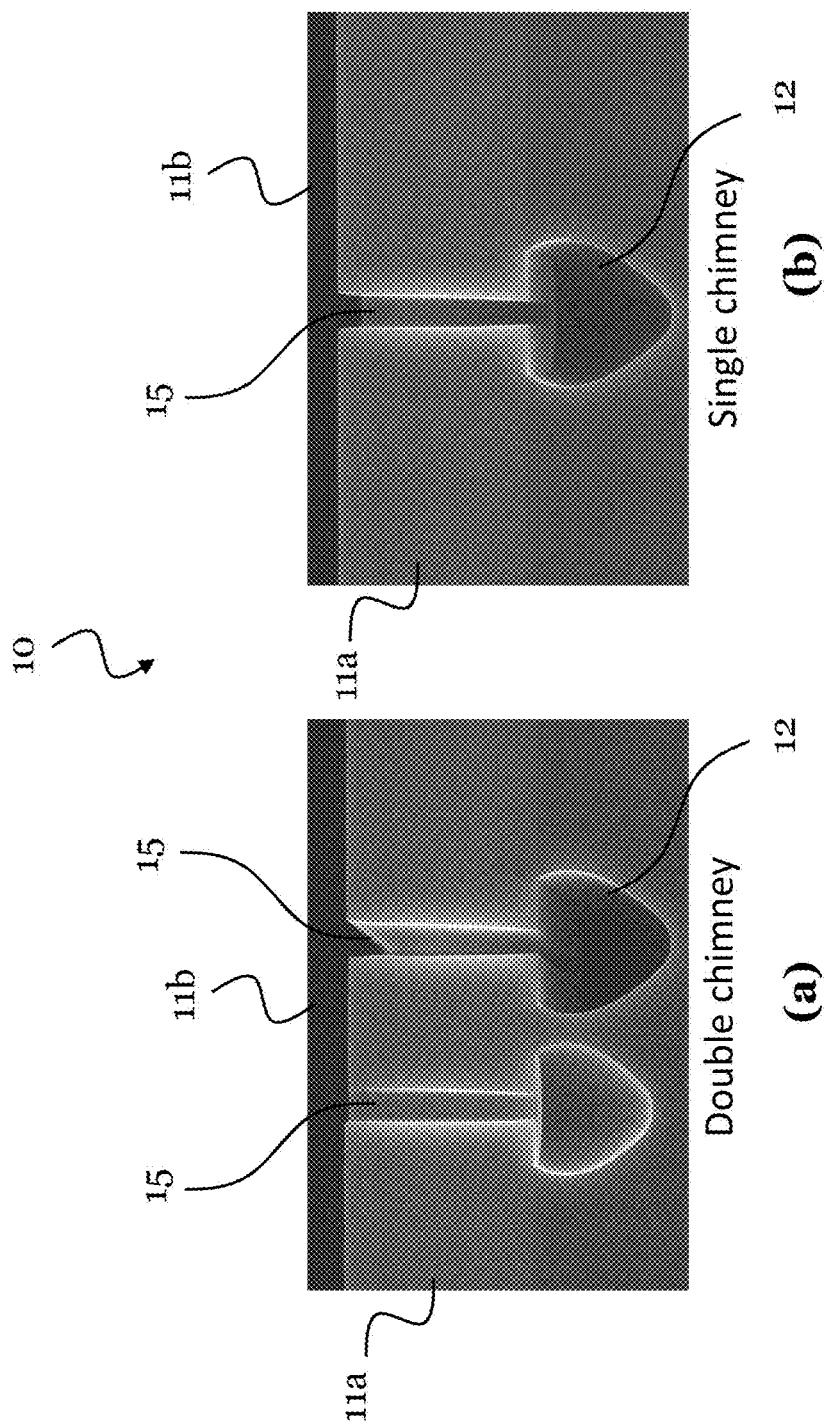
FIG. 4, parts (a) and (b), shows a further step of the detailed method according to an embodiment of the disclosure.

FIG. 4, parts (a) and (b), relates to FIG. 1, part (a), and shows the step 10a of performing the first dry etch. As mentioned above, this step 10a may be performed through the trenches 15 formed in the previous step, as shown in FIG. 3, parts (a) and (b). The step 10a of the first dry etch may comprise an etching step that uses or contains a fluorine. In particular, the step 10a of the first dry etch may comprise an etching step using/containing sulfur hexafluoride ($SF_6$) and/or xenon difluoride ($XeF_2$), optionally in further combination with argon and/or helium. For instance, a $SF_6$/argon dry etch step 10a may be performed for a duration of 1000-1400 s, at a temperature of 80-120° C., in particular for a duration of 1200 s at a temperature of 100° C.

Figure 5:
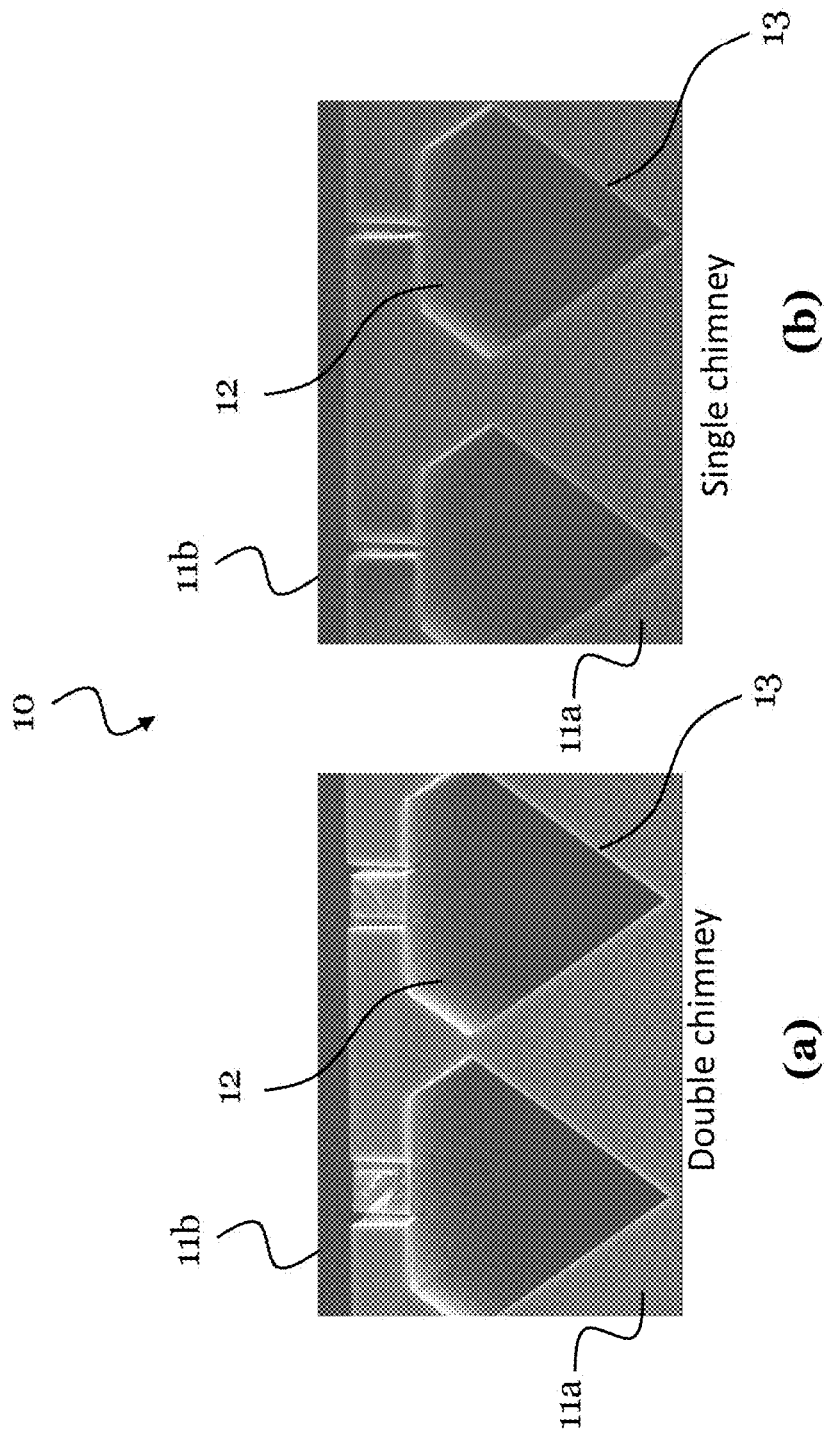
FIG. 5, parts (a) and (b), shows a further step of the detailed method according to an embodiment of the disclosure.

FIG. 5, parts (a) and (b), relates to FIG. 1, part (b), and shows the step 10b of the first wet etch. The first wet etch step 10b may comprise an etching step using or containing TMAH and/or KOH. Further, the step 10b of the first wet etch may further comprise an etching step using or containing HF to remove native oxide. In particular, first an optional etching step with the HF may be performed to remove the native oxide, for instance, for a duration of 10-20 s, particularly for a duration of 14 s, and at a concentration of e.g. 0.3%. Then the etching step with the TMAH and/or KOH may be performed for a duration of 400-800 s at a temperature of 75-85° C., particularly for a duration of 600 s at a temperature of 80° C., and e.g. at a concentration of 5%.

Figure 6:
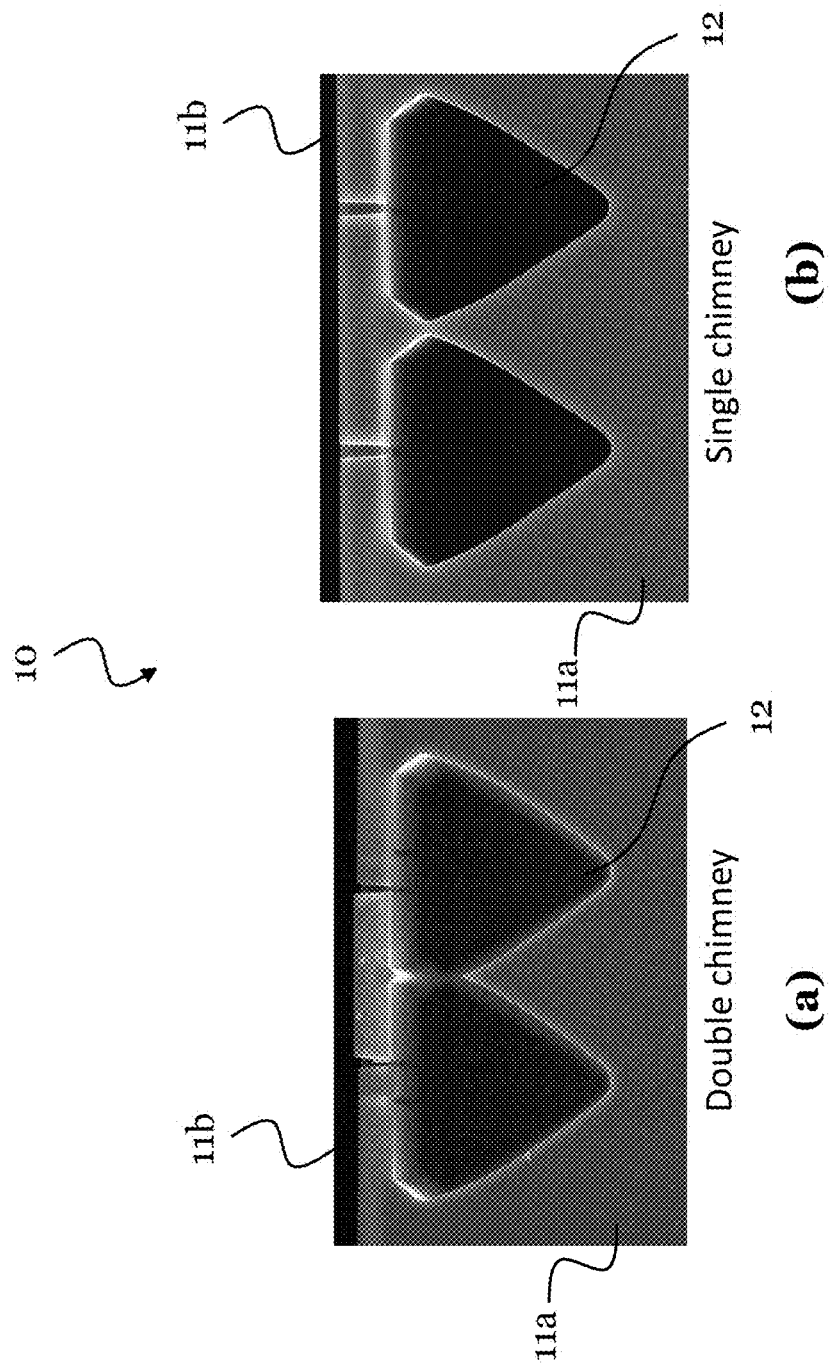
FIG. 6, parts (a) and (b), shows a further step of the detailed method according to an embodiment of the disclosure.

FIG. 6, parts (a) and (b), relates to FIG. 1, part (c), and shows the step 10c of the second dry etch. Like the first dry etch step 10a, the second dry etch step 10c may comprise an etching step containing or using fluorine. In particular, the first dry etch step 10a may comprise an etching step using or containing sulfur hexafluoride ($SF_6$) and/or xenon difluoride ($XeF_2$), optionally in further combination with argon and/or helium. For instance, a $SF_6$/argon dry etch step 10c may be performed for a duration of 1000-1400 s at a temperature of 80-120° C., in particular for a duration of 1200 s at a temperature of 100° C. The second dry etch step 10c breaks the silicon facets 13, particularly the 54° facets, formed in the second wet etch step 10b.

FIG. 7, parts (a) and (b), relates to FIG. 1, part (d), and shows the step 10d performing the second wet etch. Like the first wet etch step 10b, also the second wet etch step 10d may comprise an etching step using or containing TMAH and/or KOH. Further, the second wet etch step 10d may further comprise an etching step using or containing HF to remove native oxide. In particular, first an optional etching step with the HF may be performed to remove the native oxide, for instance for a duration of 10-20 s, particularly for a duration of 14 s, and at a concentration of e.g. 0.3%. Then, the etching step with the TMAH and/or KOH may be performed for a duration of 400-800 s at a temperature of 75-85° C., particularly for a duration of 600 s at a temperature of 80° C., and at a concentration of e.g. 5%.

Optionally, a step of stripping and/or a step of cleaning may be performed between each dry etch step 10a or 10c, and the subsequent wet etch step 10b or 10d. Notably, the dry etch steps 10a and 10c may comprise selective bulk silicon etches and/or isotropic etches. Further, the wet etch steps 10b and 10b may comprise anisotropic wet etches. Each dry etch and each wet etch, respectively, (further) expands the one or more cavities 12, i.e., the more of such etches are performed, the larger the one or more cavities 12 become.

The dry etches and wet etches may be further cycled (i.e., even further dry and wet etches may alternatingly be performed), until for example a top side 70 of the one or more cavities 12 touches/reaches the insulator layer 11b, and/or until at least two adjacent cavities of the one or more cavities 12 merge, i.e. form a larger cavity. Notably, merging of two or more adjacent cavities 12 may happen faster in the "Double chimney" variant, because the cavities are formed closer together, thus the cavities 12 may have smaller sizes at this process stopping point when the cavities 12 merge.

Promising result have been demonstrated for the method 10 described above, particularly when used in a 300 mm SOI photonic platform, wherein even already existing tools could be reused. The process time achieved with the method 10 can be significantly reduced. In addition, the method 10 can be well scalable, i.e., UCUT dimensions could be extended by repeating cycles of dry etch/wet etch (e.g. plasma/TMAH) to reach the profile required, and/or by choosing "Single chimney", "Double chimney", or other variants of the method 10.

What is claimed:

1. A method for fabricating one or more cavities in a silicon substrate directly underneath an insulator layer of a silicon on insulator (SOI) structure, the method comprising:
etching one or more trenches through the insulator layer and into the silicon substrate of the SOI structure;
performing a first dry etch of the silicon substrate through the one or more trenches to create the one or more cavities in the silicon substrate directly underneath the insulator layer;
performing a first wet etch of the silicon substrate through the one or more trenches to expand the one or more cavities and create silicon facets in the silicon substrate having a Miller index of (1,1,1);
performing a second dry etch of the silicon substrate through the one or more trenches to further expand the one or more cavities and to break the silicon facets created by the first wet etch; and
performing a second wet etch of the silicon substrate through the one or more trenches to further expand the one or more cavities.

2. The method according to claim 1, further comprising:
performing alternately one or more further dry etches and one or more further wet etches of the silicon substrate;
wherein each further dry etch further expands the one or more cavities and breaks silicon facets created by the preceding wet etch; and
wherein each further wet etch further expands the one or more cavities.

3. The method according to claim 1, wherein:
at least two adjacent cavities are formed in the silicon substrate, and the dry and wet etches are performed until the at least two adjacent cavities merge.

4. The method according to claim 1, wherein:
the dry and wet etches are performed until a top side of the one or more cavities reaches the insulator layer.

5. The method according to claim 1, wherein:
the dry etches are selective bulk silicon etches and/or isotropic etches.

6. The method according to claim 1, wherein:
the dry etches each comprise an etching step containing fluorine.

7. The method according to claim 1, wherein:
the dry etches each comprise an etching step using sulfur hexafluoride or xenon difluoride in combination with argon or helium.

8. The method according to claim 1, wherein:
the dry etches are each performed for a duration of 1000-1400 s at a temperature of 80-120° C.

9. The method according to claim 1, wherein:
the wet etches are anisotropic wet etches.

10. The method according to claim 1, wherein:
the wet etches each comprise an etching step using tetramethylammonium hydroxide and/or potassium hydroxide.

11. The method according to claim 10, wherein:
the wet etches each further comprise an etching step using hydrogen fluoride to remove native oxide.

12. The method according to claim 11, wherein:
each wet etch comprises an etching step using 0.2-0.4% hydrogen fluoride for a duration of 10-20 s followed by an etching step using 2-8% tetramethylammonium hydroxide for a duration of 400-800 s at a temperature of 75-85° C.

13. The method according to claim 1, further comprising:
performing a step of stripping and/or cleaning between each dry etch and the subsequent wet etch.

14. The method of claim 1, wherein the method is implemented on a 300 mm SOI (photonic) platform.

15. The method of claim 1, wherein performing the second wet etch comprises performing the second wet etch to create second silicon facets in the silicon substrate having a Miller index of (1,1,1).

* * * * *